(12) United States Patent
Lindner et al.

(10) Patent No.: US 8,254,165 B2
(45) Date of Patent: Aug. 28, 2012

(54) ORGANIC ELECTRONIC MEMORY COMPONENT, MEMORY COMPONENT ARRANGEMENT AND METHOD FOR OPERATING AN ORGANIC ELECTRONIC MEMORY COMPONENT

(75) Inventors: Frank Lindner, Dresden (DE); Karsten Walzer, Dresden (DE); Karl Leo, Dresden (DE); Philipp Sebastian, Dresden (DE)

(73) Assignee: Novaled AG, Dresden (DE)

( * ) Notice: Subject to any disclaimer, the term of this patent is extended or adjusted under 35 U.S.C. 154(b) by 277 days.

(21) Appl. No.: 12/596,314

(22) PCT Filed: Apr. 17, 2008

(86) PCT No.: PCT/DE2008/000638
§ 371 (c)(1),
(2), (4) Date: Jan. 15, 2010

(87) PCT Pub. No.: WO2008/125100
PCT Pub. Date: Oct. 23, 2008

(65) Prior Publication Data
US 2010/0135073 A1 Jun. 3, 2010

(30) Foreign Application Priority Data
Apr. 17, 2007 (DE) .......................... 10 2007 019 260

(51) Int. Cl.
*G11C 11/34* (2006.01)
(52) U.S. Cl. ........................................ 365/174; 365/148
(58) Field of Classification Search .................. 365/174, 365/148
See application file for complete search history.

(56) References Cited

U.S. PATENT DOCUMENTS

| | | | |
|---|---|---|---|
| 4,356,429 A | 10/1982 | Tang | |
| 4,769,292 A | 9/1988 | Tang et al. | |
| 5,093,698 A | 3/1992 | Egusa | |
| 5,500,537 A | 3/1996 | Tsumura et al. | |
| 5,703,436 A | 12/1997 | Forrest et al. | |
| 5,757,026 A | 5/1998 | Forrest et al. | |

(Continued)

FOREIGN PATENT DOCUMENTS
CA 2549309 9/2005
(Continued)

OTHER PUBLICATIONS

Adachi, C. et al., "Efficient electrophosphorescence using a doped ambipolar conductive molecular organic thin film," Organic Electronics 2, (2001), pp. 37-43.

(Continued)

*Primary Examiner* — Michael Tran
(74) *Attorney, Agent, or Firm* — Sutherland Asbill & Brennan LLP (57) ABSTRACT

The invention relates to an organic electronic memory component having an electrode and a counterelectrode and an organic layer arrangement formed between said electrode and counterelectrode and in electrical contact herewith, wherein the organic layer arrangement comprises the following organic layers: an electrode-specific charge carrier transport layer and a counterelectrode-specific charge carrier-blocking layer and disposed between said electrode-specific charge carrier transport layer and counterelectrode-specific charge carrier-blocking layer a memory layer region having a charge carrier-storing layer and a further charge carrier-storing layer between which charge carrier-storing layer and a further charge carrier-storing layer is disposed a charge carrier barrier layer. Furthermore the invention relates to a method for the operating of an organic electronic memory component.

13 Claims, 9 Drawing Sheets

US 8,254,165 B2
Page 2

U.S. PATENT DOCUMENTS

| | | |
|---|---|---|
| 5,811,833 A | 9/1998 | Thompson |
| 5,840,217 A | 11/1998 | Lupo et al. |
| 5,917,280 A | 6/1999 | Burrows et al. |
| 5,969,474 A | 10/1999 | Arai |
| 5,989,785 A | 11/1999 | Ishihara et al. |
| 6,023,073 A | 2/2000 | Strite |
| 6,107,734 A | 8/2000 | Tanaka et al. |
| 6,274,980 B1 | 8/2001 | Burrows et al. |
| 6,303,238 B1 | 10/2001 | Thompson et al. |
| 6,310,360 B1 | 10/2001 | Forrest et al. |
| 6,337,492 B1 | 1/2002 | Jones et al. |
| 6,406,804 B1 | 6/2002 | Higashi |
| 6,437,769 B1 | 8/2002 | Kobayashi |
| 6,555,840 B1 | 4/2003 | Hudson et al. |
| 6,566,807 B1 | 5/2003 | Fujita et al. |
| 6,573,651 B2 | 6/2003 | Adachi et al. |
| 6,579,422 B1 | 6/2003 | Kakinuma |
| 6,580,027 B2 | 6/2003 | Forrest et al. |
| 6,589,673 B1 | 7/2003 | Kido et al. |
| 6,645,645 B1 | 11/2003 | Adachi et al. |
| 6,720,573 B2 | 4/2004 | Son |
| 6,734,457 B2 | 5/2004 | Yamazaki |
| 6,835,470 B1 | 12/2004 | Magain |
| 6,867,538 B2 | 3/2005 | Adachi et al. |
| 6,872,969 B2 * | 3/2005 | Redecker ............... 257/40 |
| 6,878,297 B1 | 4/2005 | Berger |
| 6,897,473 B1 | 5/2005 | Burroughes et al. |
| 6,900,588 B2 | 5/2005 | Adachi et al. |
| 6,908,783 B1 | 6/2005 | Kuehl et al. |
| 6,911,666 B2 | 6/2005 | Voutsas et al. |
| 6,933,522 B2 | 8/2005 | Lin |
| 6,936,961 B2 | 8/2005 | Liao et al. |
| 6,965,197 B2 | 11/2005 | Tyan |
| 6,979,414 B2 | 12/2005 | Hosokawa et al. |
| 7,001,536 B2 | 2/2006 | Thompson et al. |
| 7,074,500 B2 | 7/2006 | Pfeiffer |
| 7,161,292 B2 | 1/2007 | Leo |
| 7,301,167 B2 | 11/2007 | Ko |
| 7,473,410 B1 | 1/2009 | Huffman et al. |
| 2001/0033136 A1 | 10/2001 | Kawase |
| 2002/0030440 A1 | 3/2002 | Yamazaki |
| 2002/0041975 A1 | 4/2002 | Ueda et al. |
| 2002/0048688 A1 | 4/2002 | Fukuoka et al. |
| 2002/0071082 A1 | 6/2002 | Okita et al. |
| 2002/0084993 A1 | 7/2002 | Teneya |
| 2002/0098379 A1 | 7/2002 | Arakane |
| 2002/0109136 A1 | 8/2002 | Seo et al. |
| 2003/0020073 A1 | 1/2003 | Long et al. |
| 2003/0042848 A1 | 3/2003 | Park et al. |
| 2003/0052616 A1 | 3/2003 | Antoniadis et al. |
| 2003/0098946 A1 | 5/2003 | Blaessing et al. |
| 2003/0127973 A1 | 7/2003 | Weaver et al. |
| 2003/0146443 A1 | 8/2003 | Yamazaki et al. |
| 2003/0170491 A1 | 9/2003 | Liao et al. |
| 2003/0178619 A1 | 9/2003 | Forrest et al. |
| 2003/0189401 A1 | 10/2003 | Kido et al. |
| 2003/0230980 A1 | 12/2003 | Forrest et al. |
| 2004/0012980 A1 | 1/2004 | Sugiura et al. |
| 2004/0032220 A1 | 2/2004 | Cok et al. |
| 2004/0062949 A1 | 4/2004 | Pfeiffer et al. |
| 2004/0067324 A1 | 4/2004 | Lazarev et al. |
| 2004/0104394 A1 | 6/2004 | Lin et al. |
| 2004/0113547 A1 | 6/2004 | Son |
| 2004/0119400 A1 | 6/2004 | Takahashi et al. |
| 2004/0150330 A1 | 8/2004 | Suh et al. |
| 2004/0183067 A1 | 9/2004 | Strip et al. |
| 2004/0191952 A1 | 9/2004 | Shtein et al. |
| 2004/0201018 A1 | 10/2004 | Yamahara et al. |
| 2004/0214041 A1 | 10/2004 | Lu |
| 2004/0227460 A1 | 11/2004 | Liao et al. |
| 2004/0235209 A1 | 11/2004 | Hasegawa et al. |
| 2004/0251816 A1 * | 12/2004 | Leo et al. ............... 313/504 |
| 2005/0029933 A1 | 2/2005 | Liao et al. |
| 2005/0040390 A1 | 2/2005 | Pfeiffer et al. |
| 2005/0040392 A1 | 2/2005 | Wu et al. |
| 2005/0053801 A1 | 3/2005 | Eischner et al. |
| 2005/0061232 A1 | 3/2005 | Werner et al. |
| 2005/0073251 A1 | 4/2005 | Kato |
| 2005/0086251 A1 | 4/2005 | Hatscher et al. |
| 2005/0095736 A1 | 5/2005 | Padiyath et al. |
| 2005/0110009 A1 | 5/2005 | Blochwitz-Nimoth et al. |
| 2005/0118745 A1 | 6/2005 | Yamazaki et al. |
| 2005/0173700 A1 | 8/2005 | Liao et al. |
| 2005/0189875 A1 | 9/2005 | Nakada |
| 2005/0218797 A1 | 10/2005 | Bechtel et al. |
| 2005/0255334 A1 | 11/2005 | Kang et al. |
| 2005/0269943 A1 | 12/2005 | Hack et al. |
| 2005/0270279 A1 | 12/2005 | Giraldo et al. |
| 2006/0033115 A1 | 2/2006 | Blochwitz et al. |
| 2006/0038170 A1 | 2/2006 | Brunschwiler et al. |
| 2006/0061266 A1 | 3/2006 | Kang et al. |
| 2006/0065904 A1 | 3/2006 | Uemura et al. |
| 2006/0145365 A1 | 7/2006 | Halls et al. |
| 2006/0202196 A1 | 9/2006 | Kawakami et al. |
| 2006/0231843 A1 | 10/2006 | Qin et al. |
| 2006/0232992 A1 | 10/2006 | Bertram et al. |
| 2006/0238112 A1 | 10/2006 | Kasama et al. |
| 2006/0250076 A1 | 11/2006 | Hofmann et al. |
| 2006/0273310 A1 | 12/2006 | Birnstock et al. |
| 2007/0034860 A1 | 2/2007 | Nakamura et al. |
| 2007/0051946 A1 | 3/2007 | Walzer et al. |
| 2007/0278479 A1 | 12/2007 | Werner et al. |
| 2008/0143250 A1 | 6/2008 | Blochwitz-Nimoth et al. |
| 2008/0164807 A1 | 7/2008 | Hofmann et al. |
| 2008/0203406 A1 | 8/2008 | He et al. |
| 2009/0009071 A1 | 1/2009 | Murano et al. |
| 2009/0009072 A1 | 1/2009 | Wellmann et al. |

FOREIGN PATENT DOCUMENTS

| | | |
|---|---|---|
| DE | 19916745 | 10/2000 |
| DE | 10209789 | 9/2003 |
| DE | 10229231 | 1/2004 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004214120 | 7/2004 |
| JP | 2004234942 | 8/2004 |
| JP | 2005156925 | 6/2005 |
| KR | 0522687 | 10/2005 |
| TW | 200401017 | 1/2004 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03/069958 | 8/2003 |
| WO | WO 03/088271 | 10/2003 |
| WO | WO 2004/025615 | 3/2004 |
| WO | WO 2004/059606 | 7/2004 |
| WO | WO 2004/097954 | 11/2004 |
| WO | WO 2005/008801 | 1/2005 |
| WO | WO 2005/089288 | 9/2005 |

OTHER PUBLICATIONS

Adachi, C. et al., "High-efficiency organic electrophorescent devices with tris (2-phenylpyridine) iridium doped into electron-transporting materials," App. Phys. Lett. vol. 77, No. 6, Aug. 7, 2000.

Adachi, C. et al., "Nearly 100% internal phosphorescence efficiency in an organic light emitting device," Journal of Applied Physics (2001), vol. 90:10, pp. 5048-5051.

Adachi, et al. "Electroluminescence in Organic Films with Three-Layer Structure," Japanese Journal of Applied Physics, 27, L269 (1988).

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

Ammermann, D. et al., "Photonic devices based on crystalline organic semiconductors for optoelectronic integrated circuits," Jps. J. Appl. Phys. Pt. 1 (1995) vol. 34, pp. 1293-1297.

Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.

Baldo, et al. "Highly efficient phosphorescent emission from organic electroluminescent devices," Nature, vol. 395, Sep. 10, 1998, pp. 151-154.

Baldo, M. A. et al., "High efficiency fluorescent organic light-emitting devices using a phosphorescent sensitizer," Nature, (2000), vol. 403, pp. 750-753.

Baldo, M. A. et al., "Transient analysis of organic electrophosphorescence: I. Transient analysis of triplet energy transfer," Physical Review B, (2000), vol. 62:16, pp. 10958-10966.

Baldo, M. A. et al., "Very high-efficiency green organic light-emitting devices based on electrophosphorescence," Applied Physics Letters, (1999), vol. 75:1, pp. 4-6.

Baldo, M. A., et al., "Transient analysis of organic electrophosphorescence II. Transient analysis of triplet-triplet annihilation," Physical Review B, (2000), vol. 62:16, pp. 10967-10977.

Baldo, M., et al., "Organic vapor phase deposition," Advanced Materials, 1998, 10, No. 18, pp. 1505-1514.

Bandyopadhyay, A, et al. "Large conductance switching and memory effects in organic molecules for data-storage applications," Appl. Phys. Lett. 82, 1215 (2003).

Bard, A. J., Faulkner, R.J., Electrochemical Methods: Fundamentals and Applications, Wiley, 2nd Ed., 2000 (Chapter 2).

Bard, A. J., Faulkner, R.J., Electrochemical Methods: Fundamentals and Applications, Wiley, 2nd Ed., 2000 (Chapter 6).

Bastard, G., "Wave mechanics applied to semiconductor heterostructures," The Editions of Physique, (1988) pp. 64-67.

Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.

Baumgartel, H. et al., "Polarographische Untersuchungen zur Konformation von 1.2.3.4.5-pentaarylimidazoliumkationen," Ber. Bunsenges (1972) 76/2, 94-100.

Bernanose, Andre et al. "Sur un nouvea mode d'emission lumineuse chez certains composes organiques," J. de Chimie Physique, 1953, No. 1, pp. 64-68.

Birnstock, J. et al., "High Efficiency Top Emitting OLEDs on a-Si Active Matrix Backplanes with Large Aperture Ratio," OLED1: Panel, IDW '04, Dec. 8, 2004.

Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var=d1&dok_ext=pdf&filename=963580051.pdf.

Blochwitz, J. et al., "Interface electronic structure of organic semiconductors with controlled doping levels," Org. Electronics 2, 97 (2001).

Blochwitz, J., et al., "Low voltage organic light emitting diodes featuring doped phthalocyanine as hole transport material," Applied Physics Letters, vol. 73, No. 6, Aug. 10, 1998, pp. 729-731.

Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.

Bloom, C. J. et al., "Low work function reduced metal complexes as cathodes in organic electroluminescent devices," J. of Phyiscal Chemistry B, vol. 107, No. 13, pp. 2933-2938.

Campbell, A. J. et al., "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al. "Enhanced luminance in polymer composite light emitting devices," Appl. Phys. Lett., vol. 71, pp. 1145-1147, Sep. 1997.

Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.

Colle, M. et al. "Switching and filamentary conduction in non-volatile organic memories," Organic Electronics, 7, 305-312 (Oct. 2006).

Connelly, N. G. et al., "Chemical Redox Agents for Organometallic Chemistry," Chem. Rev., 96, 877 (1996).

Cotton, F. et al., "Closed-shell molecules that ionize more readily than cesium," Science, vol. 298, No. 5600, pp. 1971-1974 (Dec. 6, 2002).

D'Andrade, B.W. et al., "Relationship between the ionization and oxidation potentials of molecular organic semiconductors," Organic Electronics 6, 2005, pp. 11-20.

D'Andrade, Brian W., "Operational stability of electrophosphorescent devices containing p and n doped transport layers," Applied Physics Letters, vol. 83, No. 19, Nov. 10, 2003, pp. 3858-3860.

D'Andrade, Brian W., et al., "Efficient organic electrophosphorescent white-light emitting device with a triple doped emissive layer," Advanced Materials, No. 7, 16, Apr. 5, 2004. pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Day et al. "The use of charge transfer interlayers to control hole injection in molecular organic light-emitting diodes," Thin Solid Films, 410 (2002) pp. 159-166.

Dodabalapur et al., "Organic transistors: Two-dimensional transport and improved electrical characteristics," Science, vol. 268, p. 270 (1995).

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Feng, X.D. et al. "Ohmic Cathode for Low-Voltage Organic Light-Emitting Diodes," App. Phys. Lett., vol. 86, Article 143511 (Apr. 1, 2005): pp. 1-3.

Gao, W. et al., "Effect of electrical doping on molecular level alignment at organic-organic heterojunctions," Applied Physics Letters, vol. 82, No. 26, Jun. 30, 2003, pp. 4815-4817.

Gu, G. et al., "Transparent organic light emitting devices," Applied Physics Letters, (1996), vol. 68:19, pp. 2606-2608.

Gu, G., et al. "Transparent stacked organic light emitting devices. I. Design principles and transparent compound electrodes," Journal of Applied Physics, 1999, vol. 86, No. 8, pp. 4067-4075.

Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.

Harada, K. et al. "Ionized impurity scattering in n-doped C60 thin films," Applied Physics Letters, 91, 092118 (2007).

Harada, K. et al. "Organic Homojunction Diodes with a High Built-in Potential: Interpretation of the Current-Voltage Characteristics by a Generalized Einstein Relation," Phys. Rev. Lett. 94, 036601 (2005).

Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).

Hino, Yuichi et al., "Efficient low molecule phosphorescent organic light emitting diodes fabricated by wet-processing," Organic Electronics, Aug. 8, 2004, vol. 5, pp. 265-270.

Hong, Il-Hwa et al. "Effective hole injection of organic light-emitting diodes by introducing buckminsterfullerene on the indium tin oxide anode," Applied Physics Letters, 2005, 87, 063502-1.

Hu, Wenping et al., "Efficient red electroluminescence from devices having multilayers of a europium complex," Appl. Phys. Lett. vol. 77, No. 26, Dec. 25, 2000.

Huang, Jingsong et al., "Effect of well number on organic multiple-quantum-well electroluminescent device characteristics," Applied Physics Letters, (1998), vol. 73:23, pp. 3348-3350.

Huang, Jingsong et al., "Influence of the thickness and doping of the emission layer on the performance of organic light-emitting diodes with PiN structures," Journal of Applied Physics, (2003), vol. 93:2, pp. 838-844.

Huang, Jingsong et al., "Low operating voltage and high-efficiency organic multilayer electroluminescent devices with p-type doped hole injection layer," Jps. J. Appl. Phys., (2001), vol. 40, pp. 6630-6633.

Huang, Jingsong et al., "Low-voltage organic electroluminescent devices using pin structures," Applied Physics Letters, vol. 80, No. 1, Jan. 7, 2002, pp. 139-141.

Hughes, et al. "Electron transporting materials for organic electroluminescent and electrophosphorescent devices," Journal of Materials Chemistry (2005), vol. 15, pp. 94-107.

Hung, L.S. et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Ioannidis, A. et al., "Hole and electron transport in chloroaluminum phtalocyanin thin films," The Journal of Physical Chemistry B, 1997, vol. 101, pp. 5100-5107.

Ishii, M. et al., "Improvement of organic electroluminescent device performance by in situ plasma treatment of indium-tin-oxide surface," J. Lumin., 1165 (2000).

Kido, Junji; "Recent progress in organic light-emitting devices," Proceedings of the 1st International Display Manufacturing Conference IDMC 2000, Seoul Korea, Sep. 5, 2000, pp. 399-400.

Koch, N. et al., "Optimized hole Injection with Strong Acceptors at Organized-Metal Interfaces," Phys. Rev. Lett., vol. 95, pp. 237601-237603, Nov. 30, 2005.

Krieger et al. "Molecular analogue memory cell based on electrical switching and memory in molecular thin films," Synthetic Metals, 122, 199-202 (May 2001).

Kwong, R.C. et al. "Current Status of Electrophosphorescent Device Stability," Org. Electr., vol. 4 (2003): pp. 155-164.

Kwong, Raymond C., et al., "High operational stability of electrophosphorescent devices," Applied Physics Letters, Jul. 1, 2002, vol. 81, No. 1, pp. 162-164.

Lambert, M.A., "Volume-controlled current injection in insulators," Rep. Progr. Phys. 27, 329 (1964).

Lee et al. "The Effect of C60 doping on the device performance of organic light-emitting diodes," Applied Physics Letters, 86 (2005) 063514 (3 pages).

Lee, et al. "Effects of hydroxyl groups in polymeric dielectrics on organic transistor performance," Applied Physics Letters, 88, 162109 (2006).

Liping, Ma et al. "Nonvolatile electrical bistability of organic/metal-nanocluster/organic system," Appl. Phys. Lett. 82, 1419-1421 (Mar. 3, 2003).

Lu, Ping et al., "Synthesis of octasubstituted cyclooctatetrainees and their use as electron transporters in organic light emitting diodes," Journal of the American Chemical Society, 2000, vol. 1222, pp. 7480-7486.

Lupton, J. M. et al., "Bragg scattering from periodically microstructured light emitting diodes," Appl. Phys. Lett., vol. 77, pp. 3340-3342, Nov. 2000.

Ma, E.Y., et al. "Thin Film Transistors for Foldable Displays," IEEE Technical Digest, Electron Devices Meeting, 1997. IEDM '97. (Dec. 7-10, 1997): pp. 535-538.

Madigan, C.F. "Improvement of Output coupling efficiency of organic light emitting diodes by backside substrate modification," Appl. Phys. Lett., vol. 76, pp. 1650-1652, Mar. 2000.

Maennig, B. et al. "Controlled p-type doping of polycrystalline and amorphous organic layers: Self-consistent description of conductivity and field-effect mobility by a microscopic percolation model," Physical Review B, 64, 195208 (2001).

Matsumura, M. et al., "Analysis of current-voltage characteristics of organic light emitting diodes having a LiF/Al cathode and an Al-hydroxyquinoline/diamine junction," Applied Physics Letters, 2872 (1998).

Mattoussi, H. et al., "Photoluminescence quantum yield of pure and molecularly doped organic solid films," Journal of Applied Physics, (1999), vol. 86:5, p. 2642.

Miller, L.L. et al., "A simple comprehensive correlation of organic oxidation and ionization potentials," J. Org. Chem., 1972, vol. 37, No. 6, pp. 916-918.

Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.

Murata, Hideyuki et al., "Efficient organic light-emitting diodes with undoped active layers based on silole derivatives," Applied Physics Letters, Jan. 14, 2002, vol. 80, No. 2, pp. 189-191.

Naito, Katsuyuki et al.; "Molecular design, synthesis, and physical properties of nonpolymeric amorphous dyes for electron transport," The Journal of Physical Chemistry A, 1997, vol. 101, pp. 2350-2357.

Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assigning Values to Energy Changes of Electrode Reactions," Journal of the American Chemical Society, 96:17, Aug. 21, 1974, pp. 5656-5661.

Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.

Pfeiffer, Martin et al., "Electrophosphorescent p-i-n organic light-emitting devices for very-high-efficiency flat-panel displays," Advanced Materials, (2002), vol. 14:22, Nov. 18, 2002, pp. 1633-1636.

Pope, et al., "Single positive or negative carriers in organic crystals," Electronic Processes in Organic Crystals and Polymers, Oxford Science Publications, Oxford University Press, (1999), pp. 202-207.

Potember, R.S. et al. "Electrical switching and memory phenomena in Cu-TCNQ thin films," Appl. Phys. Lett. 34, 405 (1979).

Pudzich, R., et al., "Synthesis and characterization of new oxadizoleamine based spiro-linked fluorescence dyes," Synthetic Metals, 2003, vol. 138, pp. 21-31.

R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.

Redecker, M., et al., "Electron transport in starburst phenylquinoxalines," Applied Physics Letters, Jul. 5, 1999, vol. 75, No. 1, pp. 109-111.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.

Sato, N., et al., "Polarization Energies of Organic Solids Determined by Ultraviolet Photoelectron Spectroscopy," J. Chem. Soc. Faraday Trans. 2, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.
Shinar, J. "Organic Light-Emitting Devices—A Survey" (Adachi et al. "Design concept of molecular materials for high-performance OLED" p. 43)) AIP-Press, Springer, New York 2004.
Shirota, Yasuhiko et al., "A novel class of emitting amorphous molecular materials as bipolar radical formants: 2-{4-[bis(4-methylphenyl)amino]phenyl}-5-(dimesitylboryl)thiophene) and 2-{4-[bis(9,9-dimethylfluorenyl)amino]phenyl}-5-(dimethylboryl)thiophene," Journal of the American Chemical Society, 2000, vol. 122, pp. 11021-11022.
Shirota, Yasuhiko; "Organic materials for electronic and optoelectronic devices," Journal of Materials Chemistry, 2000, vol. 10, pp. 1-25.
Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.
Tang, C. W., et al., "Electroluminescence of doped organic thin films," Journal of Applied Physics, (1989), vol. 65:9, pp. 3610-3616.
Tang, C.W. et al., "Organic electroluminescent diodes," Applied Physics Letters, vol. 51, No. 12, Sep. 21, 1987, pp. 913-915.
Tang, T.B. et al., "Ionization thresholds of merocyanine dyes in the solid state," Journal of Applied Physics, vol. 59, (1), Jan. 1986, pp. 5-10.
Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.
Tokito, Shuzuo et al., "Improvement of emission efficiency in polymer light-emitting devices based on phosphorescent polymers," Thin Solid Films, Dec. 15, 2003, vol. 445, No. 2, pp. 353-357.
Tsiper, E.V. and Soos, Z.G.; "Charge redistribution and polarization energy of organic molecular crystals," Physical Review B; vol. 64; 195124-1.
Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.
Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.
Vissenberg, M.C. et al. "Theory of the field-effect mobility in amorphous organic transistors," Physical Review B, 27, 12964 (1998).
Volkel, A. R. et al. "Carrier transport and density of state distributions in pentacene transistors," Physical Review B, 66, 195336 (2002).
Wang, S.D. et al. "Bottom contact ambipolar organic thin film transistor and organic inverter based on $C_{60}$/pentacene heterostructure," Organic Electronics, 7 (2006) pp. 457-464.
Werner, A. G. et al., "Pyronin B as a donor for n-type doping of organic thin films," Applied Physics Letters, vol. 82, No. 25, Jun. 23, 2003, pp. 4495-4497.
Werner, A.G. et al., "n-Type Doping of Organic Thin Films Using Cationic Dyes," Adv. Funct. Mater., vol. 14, No. 3 (Mar. 2004): pp. 255-260.
Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.
Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.
Yamasaki, T. et al., "Organic Light emitting device with an ordered monolayer of silica microspheres as a scattering medium," Appl. Phys. Lett., vol. 76, pp. 1243-1245, Mar. 2000.
Yang, et al., 2003, "Self-assembly and Magnetic Properties of Cobalt Nanoparticles," Appl. Phys. Lett., 82(26): 4729.
Yang, Y. et al. "Organic electrical bistable devices and rewritable memory cells," Appl. Phys. Lett. 80, 2997 (2002).
Yao, Fu et al., "Quantum-chemical predictions of Absolute standard redox potentials of diverse organic molecules and free radicals in acetonitrile," J. Am. Chem. Soc. 2005, 127, pp. 7227-7234.
Yuan et al. "Fullerene-doped hole transport molecular films for organic light-emitting diodes," Applied Physics Letters, 86 (2005) 143509 (3 pages).
Zhi-Ming, Zhang; "Organic light emitting diodes based on new oxadiazole and pyrazoline derivatives," China Physics Letters, 2000, vol. 17, No. 6, pp. 454-456.
Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.
Zhou, X. et al., "Low-voltage inverted transparent vacuum deposited organic light-emitting diodes using electrical doping," Applied Physics Letters, vol. 81, No. 2, Jul. 29, 2002, pp. 922-924.
Zhou, X., et al. "High-efficiency electrophosphorescent organic light-emitting diodes with double light-emitting layers," Applied Physics Letters, Nov. 18, 2002, vol. 81, No. 21, pp. 4070-4072.
Final Office Action, U.S. Appl. No. 11/426,798; Dec. 30, 2009.
Non-Final Office Action, U.S. Appl. No. 11/426,798; Jun. 24, 2009.
Restriction Requirement, U.S. Appl. No. 11/426,798; Mar. 10, 2009.
Response to Office Action, U.S. Appl. No. 11/426,798; Oct. 22, 2009.
International Search Report for PCT/EP2007/003311; Nov. 1, 2007.
European Search Report and Opinion for EP05028081.7; May 18, 2006.
International Search Report for PCT/EP2006/012403; Mar. 28, 2007.
International Search Report for PCT/DE2005/001076; Dec. 20, 2005.
Canadian Search Report for Application No. 2543276; Aug. 24, 2009.
Non-final Office Action for U.S. Appl. No. 11/279,514; Jan. 14, 2010.
Response to Office Action for U.S. Appl. No. 11/279,514; Aug. 12, 2009.
Final Office Action for U.S. Appl. No. 11/279,514; May 13, 2009.
Response to Office Action for U.S. Appl. No. 11/279,514; Feb. 27, 2009.
Non-final Office Action for U.S. Appl. No. 11/279,514; Oct. 30, 2008.
Restriction Requirement for U.S. Appl. No. 11/279,514; Jul. 2, 2008.
Supplemental Notice of Allowability for U.S. Appl. No. 10/515,935; Jul. 27, 2007.
Notice of Allowance for U.S. Appl. No. 10/515,935; Jun. 5, 2007.
Office Action for U.S. Appl. No. 10/515,935; Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582; Feb. 4, 2010.
International Search Report for PCT/EP2006/012517; Mar. 20, 2007.
International Search Report for PCT/EP2007/000211; Mar. 12, 2007.
European Search Report/Opinion for EP 06026743.2; Nov. 7, 2007.
International Search Report for PCT/DE2005/001493; Jan. 19, 2006.
International Search Report for PCT/DE2008/000638; Sep. 11, 2008.
Non-Final Office Action for U.S. Appl. No. 11/421,249; Oct. 19, 2009.
Response to Office Action for U.S. Appl. No. 11/421,249; Aug. 20, 2009.
Final Office Action for U.S. Appl. No. 11/421,249; May 20, 2009.
Response to Office Action for U.S. Appl. No. 11/421,249; Mar. 18, 2009.
International Search Report for PCT/EP2006/012516; Mar. 27, 2007.
Non-Final Office Action for U.S. Appl. No. 11/574,058; Dec. 9, 2009.
Disclosure Under 37 C.F.R. 1.56 for U.S. Appl. No. 12/596,314 Submitted Herewith, Jan. 15, 2010.

* cited by examiner

BPhen

Alq_3

ORGANIC ELECTRONIC MEMORY COMPONENT, MEMORY COMPONENT ARRANGEMENT AND METHOD FOR OPERATING AN ORGANIC ELECTRONIC MEMORY COMPONENT

CROSS-REFERENCE TO RELATED APPLICATION

This is a submission pursuant to 35 U.S.C. 154(d)(4) to enter the national stage under 35 U.S.C. 371 for PCT/DE2008/000638 filed Apr. 17, 2008. Priority is claimed under 35 U.S.C. 119(a) and 35 U.S.C. 365(b) to German Patent Application Number 10 2007 019 260.8 filed Apr. 17, 2007. The subject matters of PCT/DE2008/000638 and German Patent Application Number 10 2007 019 260.8 are hereby expressly incorporated herein by reference in their entirety.

The invention relates to an organic electronic memory component, a memory component arrangement and a method for the operating of an organic electronic memory component.

BACKGROUND OF INVENTION

The conventional production of memory components in silicon technology depends on complex. circuits made of transistors, capacitors and resistors. There is a series of prior art memory principles both for volatile (for example DRAM—"Dynamic Random Access Memory") as well as non-volatile (for example so-called. flash memories). The storing of charges in the silicon-based technology however will reach its scaling limits in the foreseeable future. Furthermore the currently-used memory principles generally require expensive high-temperature processes and are less suitable for three-dimensional integration. There is therefore an intensive search underway worldwide for alternative methods and materials for the permanent storage of information.

Organic electronics has proved very promising as an alternative to silicon-based electronics. The benefits are the comparably simple processes such as printing or vaporising and allowing to condense at low temperatures, the opportunity to work on flexible substrates and the large variety of molecular materials.

There are various prior art memory components with one or more active organic layers. Potember et al.: Applied Physics Letters, Vol. 34, 1979, pages 405-407 "Electrical switching and. memory phenomena in Cu-TCNQ thin films" describe a memory element comprising a copper contact, the active organic material Cu-TCNQ and an aluminium top contact. This memory cell can be reversibly switched by deliberately applying an electrical field between a high resistance (2 MOhm) and a low resistance (200 Ohm). The switching behaviour is caused by a charge transfer complex or a volume effect in the Cu-TCNQ. Adversely in this case is the required thickness of the Cu-TCNQ layer is 10 μm*.

Yang et al.: "Applied Physics Letters, Vol. 80, 2002, pages 2997-2999 "Organic electrical bistable devices and rewritable memory cells" describe a memory cell with an organic active material 2-amino-4,5-imidazole dicarbonitrile (AIDCN). The memory cell comprises several organic layers made of (AIDCN) which enclose a thin aluminium layer. For the switching process this system requires a thin aluminium layer which is embedded between the organic layers and aluminium as the electrode material. A disadvantage of this structure is the need to use aluminium electrodes and the embedded thin aluminium layer, which makes the manufacture more expensive and particularly the ultimately un-clarified switch mechanism which hinders a systematic further development of the system.

A further memory cell with an active organic material which exhibits a switchable behaviour is described in Bandyopadhyay et al.: Applied Physics Letters, Vol. 82, 2003, pages 1215-1217 "Large conductance switching and memory effects in organic molecules for data-storage applications". The manufacture of the active organic layer described therein by Rose Bengal is extremely circuitous and requires several hours of baking in a vacuum, which effectively prevents manufacture.

Memory elements which contain different organic materials are also described by Cölle et al.: Organic Electronics, Vol. 7, 2006. pages 305-312 "Switching and filamentary conduction in non-volatile organic memories". Various metal/organic/metal structures are investigated here. The memory behaviour is caused by a thin oxide layer on the electrodes and the transport of the electrons via filaments. This work also shows that the reproducibility and reliability of the switching performance, the switch voltage and the memory element are very difficult in themselves and depend on many different uncontrollable. causes. Also the underlying switching mechanisms are ultimately unclear which impedes further optimisation of this memory.

Krieger et. al. in "Synthetic Metals. Vol. 122, 2001, pages 199-202 "Molecular analogue memory cell based on electrical switching and memory in molecular thin films" disclose a test structure comprising an array of 8×8 cells of a size 100 μm×100 μm. Between two metal electrodes is a polymer film (polyphenylacetylene) of thickness 100 to 500 nm mixed with 5-7% NaCl. By slowly increasing the voltage to the electrodes the NaCl is separated into Na+−and CL−−ions. These travel towards the electrodes and cause the resistance to change. This can now be exploited to create a memory cell. This structure has the disadvantage that a strong electrical field must he applied to the electrodes for a long time to trigger the diffusion of the ions, i.e. rapid switching is fairly improbable. Furthermore this structure is a volatile storage cell since the electrical field is switched off the ions travel away from the electrodes through their concentration gradients in the layer and thereby the status cannot be retained.

The cited works all have in common the fact that the switching effects are not clearly defined and for example depend on the forming of metallic filaments, the diffusion of ions or metal atoms, or on substances shifting onto contacts.

The company Thin Film Electronics (www.thinfilm.se) together with the company Xaar has developed an organic Ferro-electrical polymer which can act as a non-volatile memory. This approach exploits the ferro-electrical properties of a polymer which can be expected to be more stable in comparison to the aforementioned effects. Typical for components of polymer electronics is their composition of one or two (seldom several) polymer layers due to the problem when precipitating of polymer heterostructures that already-precipitated layers must not be detached again, however there are only two main groups of polymer solvents, namely hydrophilic and hydrophobic. It is therefore hard to produce complicated layer stacks from polymers.

The memory mechanisms cited above can be linked to form memory modules which are based on different technologies. The simplest is the arrangement in a matrix of crossed metallic conducting contacts, as used for example by Krieger et. al.: Synthetic Metals, Vol. 122, 2001, pages 199-202 "Molecular analogue memory cell based on electrical switching and memory in molecular thin films". This arrangement can be used to produce high memory densities. It is sufficient with respect to the structuring of the memory cells to structure the contact tracks while the intermediately disposed organic(n) layer(s) can be applied over large surfaces whereby the technologically difficult lateral structuring of organic materials can be avoided.

SUMMARY OF THE INVENTION

The object of the invention is to create an improved organic electronic memory component, a memory component arrangement and an improved process for the operating of an organic electronic memory component which exhibit a stable and reproducible memory behaviour.

The object is achieved by an organic electronic memory component according to the independent claim 1 and a memory component arrangement according to the independent claim 14 and a process for its operating according to the independent claim 16. Beneficial embodiments of the invention are the subject of dependant sub-claims.

The invention comprises the concept of an organic electronic memory component having an electrode and a counterelectrode and an organic layer arrangement formed between said electrode and counterelectrode and in electrical contact herewith, wherein the organic layer arrangement comprises the following organic layers: an electrode-specific charge carrier transport layer and a counterelectrode-specific charge carrier-blocking layer and disposed between the two a memory layer region with a charge carrier-storing layer and a further charge carrier-storing layer between which a charge carrier barrier layer is disposed.

Benefits of the invention with respect to the state of the art exist particularly in that such a memory component can be produced cost-effectively with the aid of standard manufacturing processes. Unlike the difficult-to-control mechanisms in the case of memory modules which use a formation of metallic filaments or the diffusion of ions or metal atoms or even the process of shifting onto contacts, the invention permits a controlled, stable and reproducible storage of electronic information. By applying an electrical voltage charge carriers, in other words electrons or holes (defective electrons), are injected into the organic layer arrangement and once there are transported to the charge carrier-storing layer where they are stored. An erasing of the memory state thus produced takes place wherein the polarity of the electrical voltage applied for the storage is reversed.

The electrode and the counterelectrode are preferably made of a highly-conducting material, for example metal. Non-metallic electrode materials can be used also provided these exhibit an electric conductivity of at least 100 S/cm. Such non-metallic electrode materials include for example electrically highly conducting oxides, nitrides and polymers.

A preferred further development of the invention provides that the electrode-specific charge-carrying transport layer is electrically doped. In this case the difference is that the counterelectrode-specific charge carrier-blocking layer is not usually electrically doped. The electrode-specific charge-carrying transport layer acts to inject charge carriers in form of electrons or holes(defective electrons) effectively into the organic layer arrangement and to transport them there without significant electrical loss.

The electrical doping of organic materials is as such known in different embodiments. The organic materials can be provided with n-doping or p-doping. N-dopants are generally molecules or neutral radicals which exhibit a HOMO level (HOMO—"Highest Occupied Molecular Orbital") of less than 4.5 eV, preferably less than around 2.8 eV and further preferably less than around 2.6 eV. The HOMO level of the doping material can be determined from cyclovoltammetric measurements of the oxidation potential. Alternatively the reduction potential of the donator cation can be determined in a salt of the donator. The donator should exhibit an oxidation potential which is less than or equal to −1.5V, preferably less than or equal to around −2.0V and further preferably less than or equal to around −2.2V with respect to the Fc/Fc+(ferrocene/ferrocenium redox pair). The molar mass of the n-doping material preferably amounts to between around 100 and around 2000 g/mol and further preferably to between around 200 and 1000 g/mol. A molar doping concentration for electric n-doping amounts in a preferred embodiment to between 1:1000 (acceptor molecule:matrix molecule) and 1:2, preferably to between 1:100 and 1:5 and further preferably to between 1:100 and 1:10. The specified embodiments respectively improve the stability of the dopants, the smaller the oxidation potential, the less they are stable in air.

It can be provided that the donator first farms from a precursor during the manufacture of the organic layers or a subsequent layer-manufacturing process as described in the document DE 103 07 125. The formerly specified values for the HOMO level of the donator then relate to the species hereby arising. Alternatively the doping of the organic material may be manufactured in a different manner and method. These include for example a co-vaporisation of the organic material with a metal of a lesser work function. Lithium and Caesium are suitable for a n-doping for example.

P-dopants are generally molecules or neutral radicals in which the LUMO level (LUMO—"Lowest Unoccupied Molecular Orbital") is energetically higher than 4.5 eV, preferably higher than 4.8 eV and further preferably higher than 5.04 eV. The LUMO level of the acceptor for p-doping can be determined with the aid of cyclovoltammetric measurements of the reduction potential. The acceptor preferably exhibits a reduction potential with respect to Fc+ of at least −0.3V, further preferably of at least 0.0V and further preferably of at least around 0.24V. Preferably used are acceptors with a molar mass of around 100 to 2000 g/mol, preferably with a molar mass of between around 200 and 1000 g/mol and further preferably with a molar mass of between around 300 g/mol and 2000 g/mol. The molar doping concentration for p-doping in an expedient embodiment lies between 1:1000 (acceptor molecule: matrix molecule) and 1:2, preferably between 1:100 and 1:5 and further preferably between 1:100 and 1:10. The acceptor may first form from a precursor during the layer-manufacturing process or the subsequent layer-manufacturing process. The above-specified LUMO level of the acceptor then relates to the arising species.

In an convenient embodiment of the invention it may be provided that a charge carrier injection layer is formed between the electrode and the electrode-specific charge-carrying transport layer. In this case particularly salts of lithium and of caesium but also of rubidium, potassium and sodium can be used to manufacture the charge carrier injection layer. The layer thickness lies preferably in the region of a few angstroms to a few nanometers.

A advantageous embodiment of the invention provides an electron-based memory embodiment wherein the electrode is embodied as a cathode and the counterelectrode as an anode and the electrode-specific charge-carrying transport layer is a cathode-specific electron transport layer, the counterelectrode-specific charge carrier-blocking layer is an anode-specific electron-blocking layer, the charge carrier-storing layer is an electron-storing layer, the further charge carrier-storing layer is a further electron-storing layer and the charge carrier barrier layer is an electron barrier layer.

Preferably a further embodiment of the invention provides that the following energetic relationships apply: the LUMO level of the cathode-specific electron transport layer lies energetically higher than the LUMO level of the electron-storing layer, which electron-storing layer is disposed adjacently with respect to the cathode-specific electron transport layer. the LUMO level of the anode-specific electron-blocking layer lies energetically higher than the LUMO level of the further electron-storing layer, which further electron-storing layer is disposed adjacently with respect to the anode-specific electron-blocking layer and the LUMO levels of the electron-storing layer and the further electron-storing layer lie energetically lower than the LUMO level of the electron barrier layer. In this way so-called potential wells are formed in the region of the electron-storing and the further electron-storing layer in which potential wells the electrons are stored in that they "are trapped" there.

In an advantageous embodiment of the invention it may be provided that the LUMO level of the anode-specific electron-blocking layer lies energetically higher than the respective LUMO level of the following layers: electron-storing layer, further electron-storing layer and cathode-specific electron transport layer.

A further embodiment of the invention can provide that for the electron-storing layer and the further electron-storing layer at least the LUMO level of the electron-storing layer or at least the LUMO level of the further electron-storing layer is energetically lower by around 0.1 eV to around 3.0 eV than the LUMO level of the anode-specific electron-blocking layer.

A preferred further embodiment of the invention provides a hole-based memory embodiment wherein the electrode is embodied as an anode and the counterelectrode as a cathode and the electrode-specific charge-carrying transport layer is an anode-specific hole transport layer, the counterelectrode-specific charge carrier-blocking layer is a cathode-specific hole-blocking layer, the charge carrier-storing layer is a hole-storing layer and the further charge carrier-storing layer and a further hole-storing layer and the charge carrier barrier layer are a hole barrier layer.

In an convenient embodiment of the invention it can be provided that the following energetic relationships apply: the HOMO level of the anode-specific hole transport layer is energetically higher than the HOMO level of the hole-storing layer, which hole-storing layer is disposed adjacently with respect to the anode-specific hole transport layer, the HOMO level of the cathode-specific hole-blocking layer is energetically higher than the HOMO level of the further hole-storing layer, which hole-storing layer is disposed adjacently with respect to the cathode-specific hole-blocking layer and the HOMO level of the hole-storing layer and the further hole-storing layer are energetically higher than the HOMO level of the hole barrier layer. In this way so-called potential wells are formed in the region of the hole-storing layer and the further hole-storing layer in which potential wells holes can be stored wherein they "are trapped" there.

An advantageous embodiment of the invention provides that the HOMO level of the cathode-specific hole-blocking layer is energetically higher than the respective HOMO level of the following layers: hole-storing layer, further hole-storing layer and anode-specific hole transport layer.

A further embodiment of the invention preferably provides that for the hole-storing layer and the further hole-storing layer at least the HOMO level of the hole-storing layer or at least the HOMO level of the further hole-storing layer lies energetically around 0.1 eV to around 3.0 eV lower than the HOMO level of the cathode-specific hole-blocking layer.

In an advantageous embodiment of the invention it may be provided that an electrical resistance via the electrode, the counterelectrode and the organic layer arrangement in an on-status and an off-status respectively lies in a range of around 1 Ohm to around 100 MOhm, preferably within a range of around 0.1 kOhm to around 100 kOhm. Generally in this case a status with the greater resistance is designated as an off-status and a status with a comparatively smaller resistance as an on-status.

A further development of the invention can provide that the ratio of the electrical resistances via the electrode, the counterelectrode and the organic layer arrangement in the on-status and the electrical resistance in the off-status shall be greater than 1:1.5.

In the case of the method for operating the organic electronic memory component it may be provided that a further storage procedure is carried out wherein an electrical current having the polarity and a further voltage value is applied to the electrode and the counterelectrode which voltage value is different to a previously applied voltage value. By this means it is possible to store more than one memory state in a non-volatile manner. The different voltages used for the write process produce a different charge transfer in the organic layer stack such that different resistance values are set for the component.

DESCRIPTION OF THE EMBODIMENTS OF THE INVENTION

The invention is hereinafter described in further detail on the basis of an exemplified embodiment with reference to drawings. The drawings show

FIG. 12A-12F: various distinct hystereses for different voltages.

Figure 1:
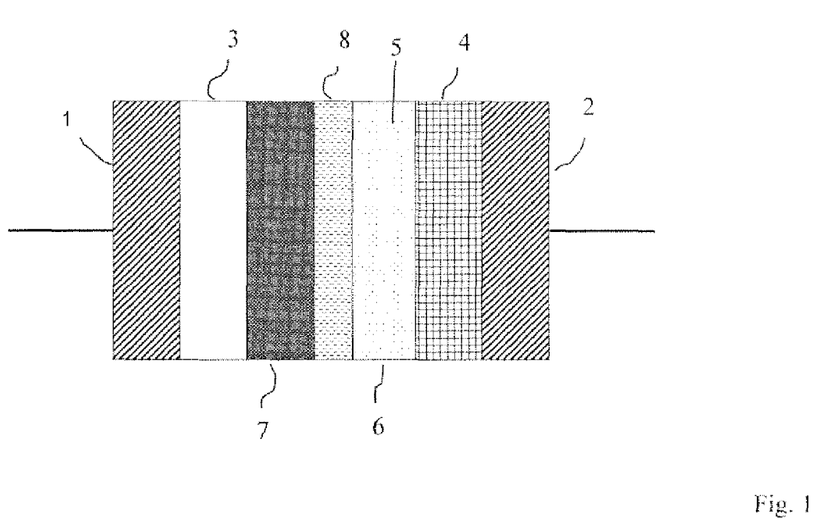
FIG. 1: a schematic illustration of a sequence of layers for an organic electronic memory component.

FIG. 1 shows a schematic illustration of a sequence of layers for an organic electronic memory component. Between an electrode 1 and a counterelectrode 2 are formed an electrode-specific charge-carrying transport layer 3, a counterelectrode-specific charge carrier-blocking layer 4 and disposed between said electrode-specific charge-carrying transport layer 3 and counterelectrode-specific charge carrier-blocking layer 4 a memory layer region 5 having a charge carrier-storing layer 6 and a further charge carrier-storing layer 7, between which charge carrier-storing layer 6 and further charge carrier-storing layer 7 is disposed a charge carrier barrier layer 8.

Figure 2:
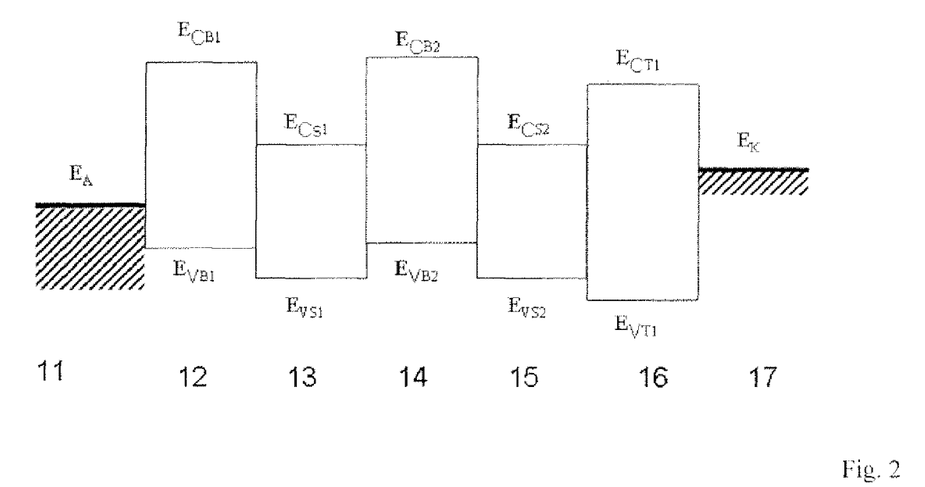
FIG. 2: a schematic illustration of energy levels for an electron-based memory component.
Figure 3:
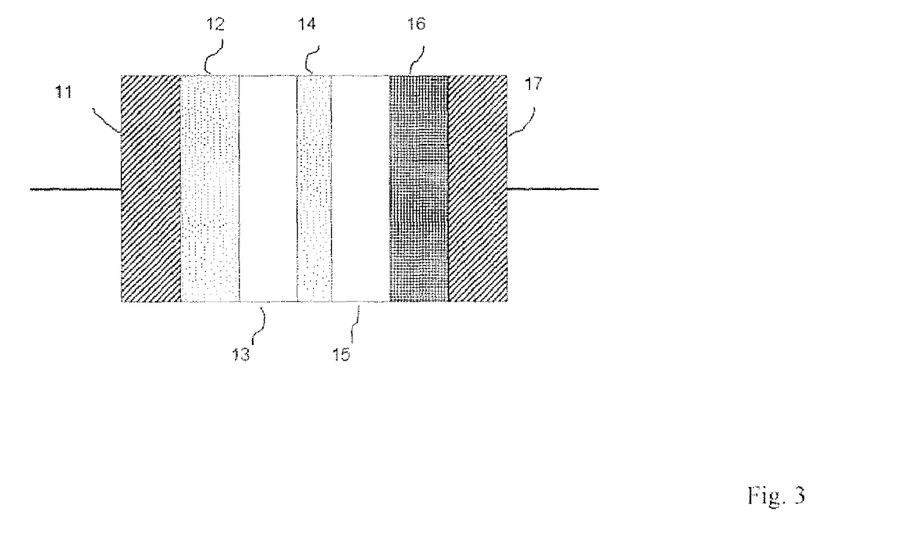
FIG. 3: a schematic illustration of a sequence of layers for the memory component from FIG. 2, FIG. 4: a schematic illustration of energy levels for an electron-based memory component.

FIG. 2 shows a schematic illustration of energy levels for an electron-based memory component. FIG. 3 shows a schematic illustration of a sequence of layers for the memory component from FIG. 2.

An anode-specific electron blocking layer 12 is formed adjacently with respect to an anode 11. Following hereafter are an electron-storing layer 13, an electron barrier layer 14, a further electron-storing layer 15 and a doped cathode-specific electron transport layer 16 which abuts against a cathode 17. The electron-storing layers 13, 15 form potential wells using their respectively energetically lower LUMO levels. Where electrons find themselves in these wells it is difficult for said electrons to leave the potential wells again because they must first overcome the barrier formed by the electron-blocking layer 12 and electron barrier layer 14.

For an effective action of the memory component it is beneficial to use all organic materials in a highly pure form as can he achieved for example using gradient sublimation in a vacuum. This will avoid leakage currents which can occur through so-called trap-states. Sublimation-purified organic materials are beneficial for long-term storage of charges in the component.

The following structure has been chosen as a first exemplified embodiment:
(11.1) Anode: indium-tin-oxide (ITO)
(12.1) Blocking layer for electrons: 30 nm: NHT5
(13.1) Storage layer for electrons: 60 nm $C_{60}$
(14.1) Barrier layer for electrons: 10 nm: NHT5
(15.1) Further storage layer for electrons: 50 nm $C_{60}$
(16.1) Transport layer: 30 nm BPhen doped with caesium
(17.1) Cathode: 100 nm aluminium All layers are manufactured in a vaporisation process in a vacuum. In principle such layers can be produced by other methods also such as for example spin coating, blade coating or self-assembly.

The energy levels of the HOMO and LUMO levels are
(11.1) ITO work function $E_A \sim -4.8$ eV
(12.1) NHT5: $E_{vB1} = -5.3$ eV, $E_{CB1} \sim -1.9$ eV
(13.1) $C_{60}$: $E_{VS1} = -6.0$ eV, $E_{CS1} \sim -3.8$ eV
(14.1) NHT5: $E_{vB2} = -5.3$ eV, $E_{CB2} \sim -1.9$ eV
(15.1) $C_{60}$: $E_{VS2} = -6.0$ eV, $E_{CS2} \sim -3.8$ eV
(16.1) BPhen: $E_{VT1} = -6.7$ eV, $E_{CT1} \sim -3.0$ eV
(17.1) Al: $E_k = -4.3$ eV In the case of this arrangement the requirements ECB1>ECS1, ECB2>ECS1 and ECB2>ECS2 are met.

Figure 6:
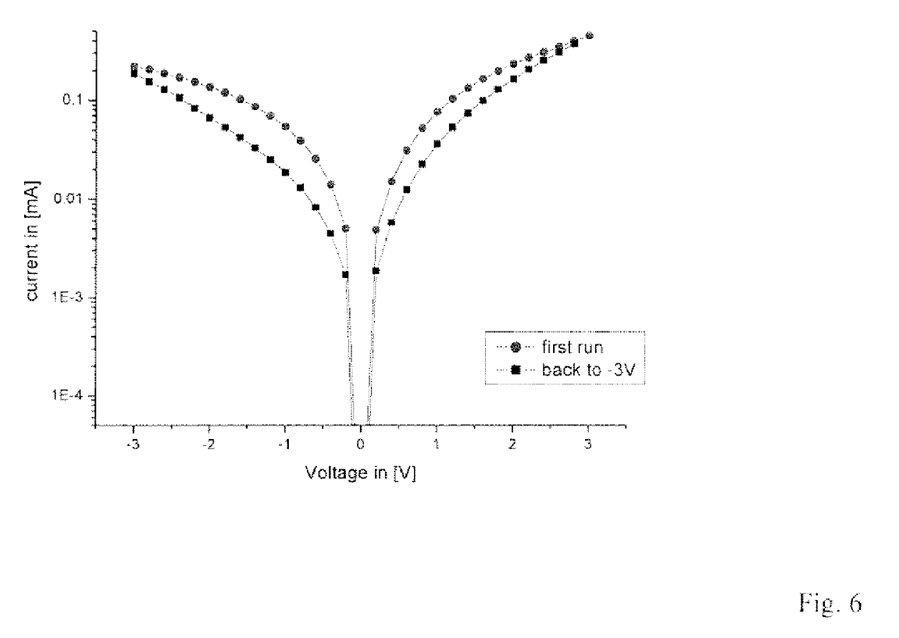

FIG. 6 shows a current-voltage curve for an organic electronic memory component according to FIGS. 2 and 3. A clear hysteresis behaviour is exhibited. The upper and the lower current-voltage curves represent a scan of −3V to 3V in 0.2V-steps and a reverse scan of 3V to −3V. If a read voltage of 0.8V is applied one obtains two different currents for the same voltage. An organic memory element based on two different statuses is thus realised.

Figure 7:
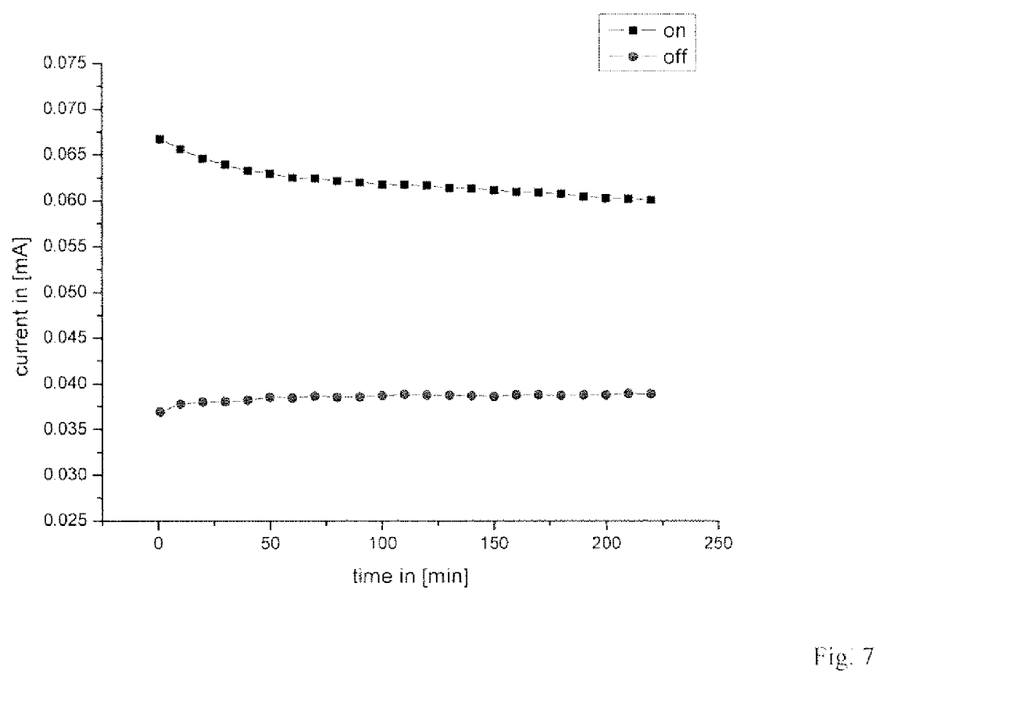

FIG. 7 shows a schematic time-controlled illustration for an on- and a off-status for an organic electronic memory component according to FIGS. 2 and 3. These statuses are non-volatile. The on- and the off-statuses are also stable without an external electrical field.

Figure 8:
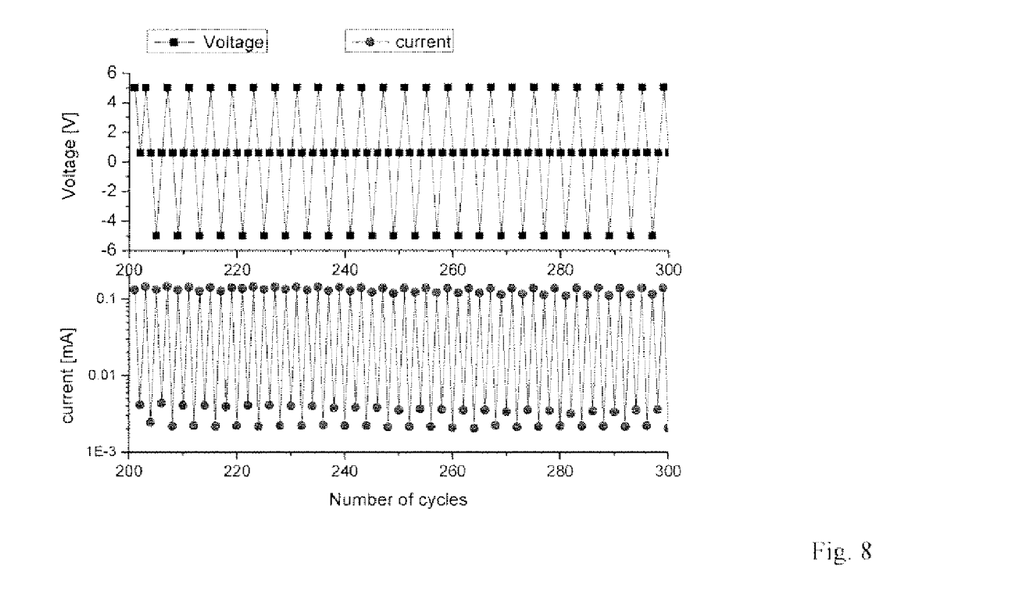
FIG. 8: an illustration of voltage and current for 100 cycles of sample according to exemplified embodiment 1.

FIG. 8 shows an illustration of 100 voltage and current cycles for an organic electronic memory component according to FIGS. 2 and 3 in the embodiment according to the formerly described exemplified embodiment. A write-voltage amounts to 5V, an erase-voltage 5V and a read-voltage 0.6V.

A non-volatile re-definable memory component can he constructed therefore using this component.

The following materials which exhibit comparable properties can be used in place of the material NHT5 used in the preceding exemplified embodiment: MeO-TPD: N,N,N',N'-tetrakis(4-methoxy-phenyl) benzidine, m-MTDATA: 4.4'0.4"-tri(N-3-methylphenyl-N-phenyl-amino) triphenylamine or pentacene.

In a second exemplified embodiment for an electron-based memory component according to the FIGS. 2 and 3 the following construction is provided:
(11.2) Anode: indium-tin-oxide (ITO)
(12.2) Blocking layer for electrons: 30 nm: NHT5
(13.2) Storage layer for electrons: 50 nm C60
(14.2) Barrier layer for electrons: 10 nm: NHT5
(15.2) Further storage layer for electrons: 30 nm C60
(16.2) Transport layer: 30 nm: NET5 doped with NDN1 (8%)
(17.2) Cathode: 100 nm Aluminium The cathode-specific electron transport layer 16 is made of NET5 (Novaled AG, Dresden). NDN1 (Novaled AG, Dresden) is used as a molecular dopant. In place of the material combination. NET5/NDN1 used in the previous exemplified embodiment the following materials can be used which exhibit comparable characteristics: Bphen (4,7-diphenyl-1,10-phenanthrolin) doped with Cs (see also first exemplified embodiment above), C60 doped with "Acridine Orange Base" or zinc phialocyanin doped with Ru(terpy)2.

In a third exemplified embodiment for an electron-based memory component according to the FIGS. 2 and 3 the following construction is provided:
(11.3) Anode: indium-tin-oxide (ITO)
(12.3) Blocking layer for electrons: 30 nm: NHT5
(13.3) Storage layer for electrons: 80 nm C60
(14.3) Barrier layer for electrons: 10 nm: NHT5
(15.3) Further storage layer for electrons: 50 nm C60
(16.3) Transport layer: 30 nm: BPhen doped with caesium
(17.3) Cathode: 100 nm Aluminium All layers are manufactured in a vaporisation process in a vacuum. In principle such layers can be produced by other methods also such as for example spin coating, blade coating or self-assembly. The energy levels of the HOMO and LUMO levels are
(11.3) ITO work function $E_A \sim -4.8$ eV
(12.3) NHT5: E vB1 = −5.3 eV, E CB1 ~ −1.9 eV
(13.3) $C_{60}$: $E_{VS1} = -6.0$ eV, $E_{CS1} \sim -3.8$ eV
(14.3) NHT5: $E_{vB2} = -5.3$ eV, $E_{CB2} \sim -1.9$ eV
(15.3) $C_{60}$: $E_{VS2} = -6.0$ eV, $E_{CS2} \sim -3.8$ eV
(16.3) BPhen: $E_{VT1} = -6.7$ eV, $E_{CT1} \sim -3.0$ eV
(17.3) Al: $E_k = -4.3$ eV This exemplified embodiment relates to a memory component which is constructed similarly to the component described in the first exemplified embodiment, wherein however in this case more than two memory statuses can be used. If the erase- and the write-voltages are reduced or enlarged there is no visible hysteresis behaviour between voltage changes from −1V to +1V and back. If the voltage is now changed from −5V to 5V and back, a clear hysteresis behaviour becomes evident (see also FIG. 12A to 12F). In this case the lower portion of the hysteresis curve shifts significantly. Different currents therefore ensue and thus different conductivity values for a particular read-voltage which is below the write- or erase-voltage. This can be exploited to store several statuses in this component. In this exemplified embodiment the different conductivity value statuses are also maintained without an external electrical field being applied such that a non-volatile memory performance is obtained.

In a fourth exemplified embodiment for an electron-based memory component according to the FIGS. 2 and 3 the following construction is provided:
- (11.4) Anode: indium-tin-oxide (ITO)
- (12.4) Blocking layer for electrons: 30 nm: NHT5
- (13.4) Storage layer for electrons: 60 nm $C_{60}$
- (14.4) Barrier layer for electrons: 10 nm: NHT5
- (15.4) Further storage layer for electrons: 50 nm $C_{60}$
- (16.4) Transport layer: 30 nm BPhen
- (17.4) Cathode: 100 nm Aluminium This exemplified embodiment relates to a component which is constructed identically with respect to the construction described in the first exemplified embodiment, wherein however the electron transport layer 16 is not electrically doped. Such transport layers as such are prior art for holes and also for electrons, particularly from the field of organic LEDs. An electron injection layer made of linen is provided, electron injection layer which is disposed between the further storage layer (15.4) and the cathode (17.4).

The memory component according to the fourth exemplified embodiment is electron-based. Such a charge carrier injection can be provided also for hole-based memory components (see also explanations with respect to the FIGS. 4 and 5 below), for example using a substrate with high work function (between 4.5 and 6.0 eV). Alternatively in the case or the hole based memory component the charge-carrying transport layer may also comprise a good hole-conducting polymer, for example made of PEDOT, PEDOT:PSS or polyaniline.

In a fifth exemplified embodiment for an electron-based memory component according to the FIGS. 2 and 3 the following construction is provided:
- (11.5) Anode: indium-tin-oxide (ITO)
- (12.5) Blocking layer for electrons: 30 nm: NHT5
- (13.5) Storage layer for electrons: 60 nm $C_{60}$
- (14.5) Barrier layer for electrons: 10 nm: NHT5
- (15.5) Storage layer for electrons: 50 nm $C_{60}$
- (16.5-1) Transport layer: 30 nm $Alq_3$
- (16.5-2) Injection layer: 1 nm LiF
- (17.5) Cathode: 100 nm Aluminium This exemplified embodiment relates to a memory component which differs from the preceding exemplified embodiment to the effect that the electron injection takes place using a thin electron injection layer (16.5-2) which thin electron injection layer (16.5-2) is disposed between the cathode and electron transport layer (16.5-1). Such transport layers as such are prior art for holes and also for electrons, for example from the field of organic LEDs. A layer of lithium-fluoride (LiF) of a few angstroms thickness is used in the preceding exemplified embodiment, which layer of lithium-fluoride (LiF) is followed by the electron transport layer of Alq3.

The memory component according to the fifth embodiment is electron-based. Such a charge carrier injection is also possible for hole-based components, for example using the ITO layer sequence (anode)/WO3/hole transport layer . . . , wherein in this case WO3 acts as the injection layer. Also other hole injection materials can be used, tor example conductive polymers PEDOT:PSS.

Figure 4:
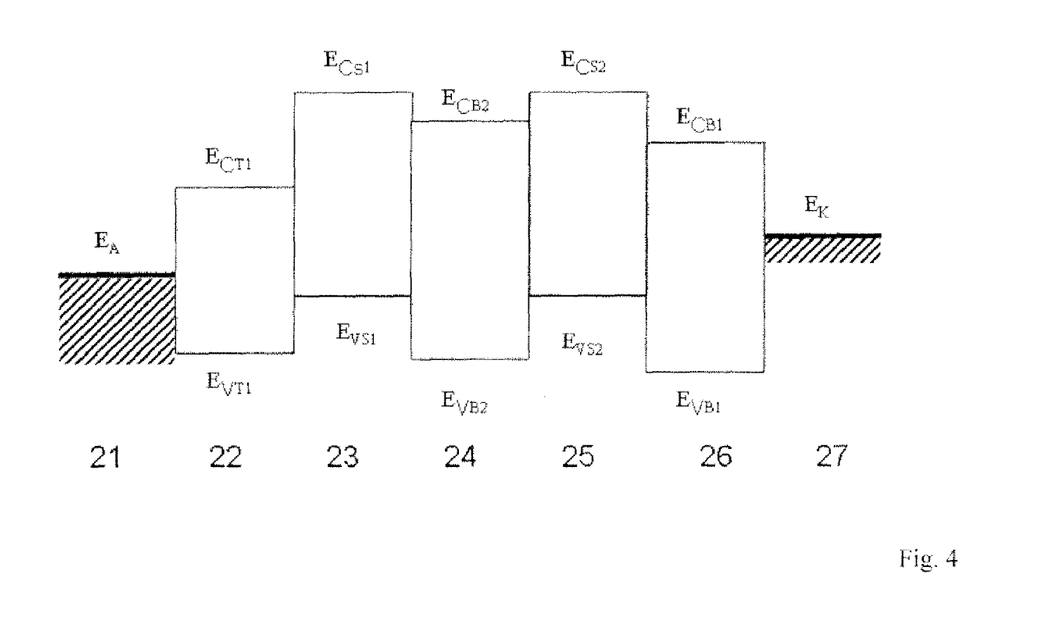
Figure 5:
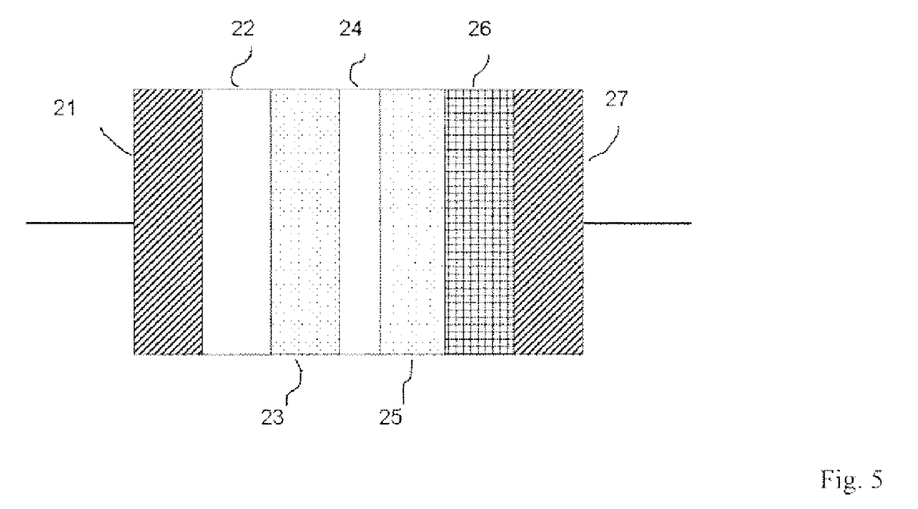
FIG. 5: a schematic illustration of a sequence of layers for the memory component from FIG. 4, FIG. 6: a current-voltage curve for an organic electronic memory component according to FIGS. 2 and 3, FIG. 7: a schematic time-controlled illustration for an on- and a off-status for an organic electronic memory component according to FIGS. 2 and 3.

FIG. 4 shows a schematic illustration of energy levels for a hole-based memory component. FIG. 5 shows a schematic illustration of a sequence of layers for the memory component from FIG. 4.

An anode-specific, electrically-doped hole transport layer 22 is formed on an anode 21. This is followed by a hole-storing layer 23, a hole barrier layer 24, a further hole-storing layer 25 and a hole-blocking layer 26, which hole-blocking layer 26 abuts against a cathode 27. The two hole-storing layers 23, 25 use their respectively energetically higher HOMO levels to form potential wells for holes. If holes find themselves in these wells it is difficult for said holes to escape from the wells since first they need to overcome a barrier. A combination of MeO-TPD:F4-TCNQ, whose use as layer material as such is prior art from the field of organic LEDs, can be used for example as a doped hole transport layer.

Figure 9:
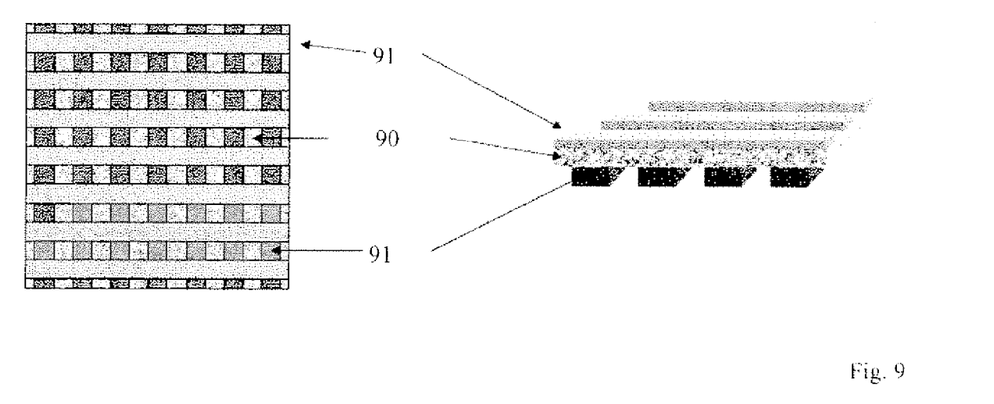
FIG. 9: a schematic illustration of an electronic organic memory component, in the case of which electrode strips are formed on both sides of an organic layer arrangement in the design according to FIG. 3 or FIG. 5, FIG. 10: a schematic illustration of a 3D-integration of several memory components according to FIG. 9, FIG. 11: structural formulae of organic materials

FIG. 9 shows a schematic illustration of an electronic organic memory component in the case of which electrode strips 91 are formed on both sides, specifically on the top and underneath, of an organic layer arrangement 90 in the embodiment according to FIG. 3 or FIG. 5.

Figure 10:
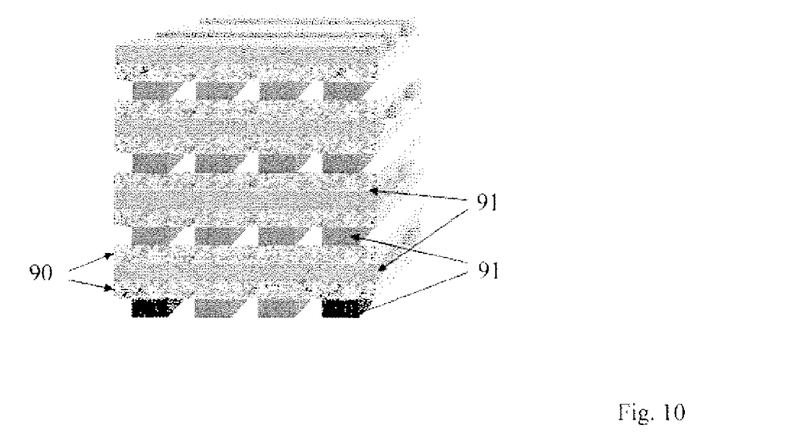
Figure 11:
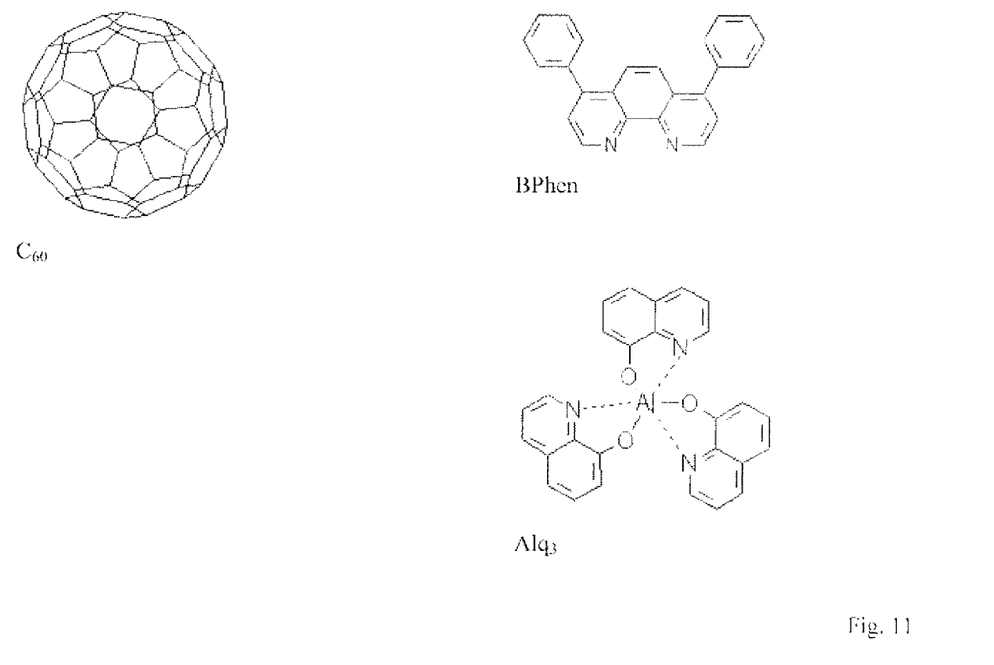
Figure 12A:
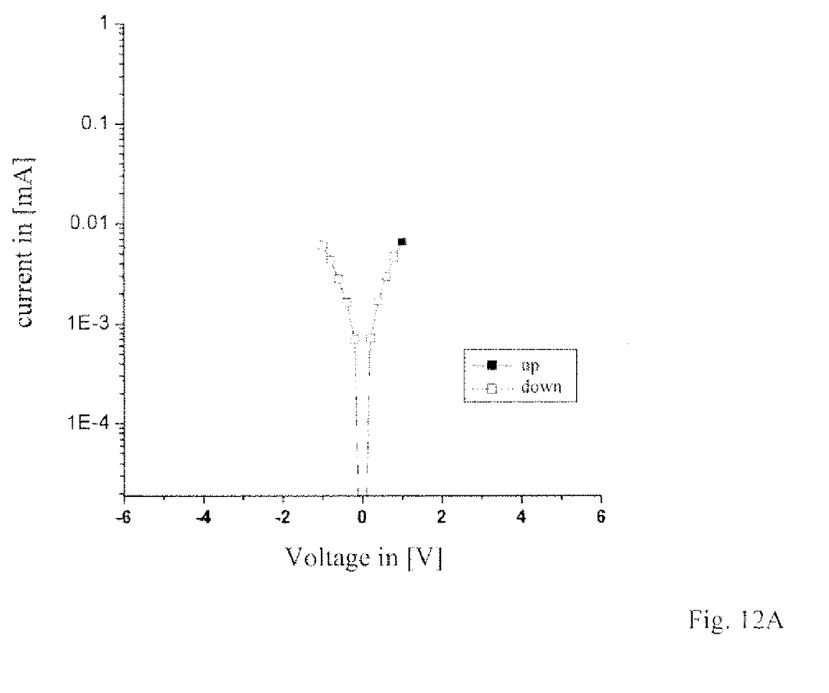
Figure 12B:
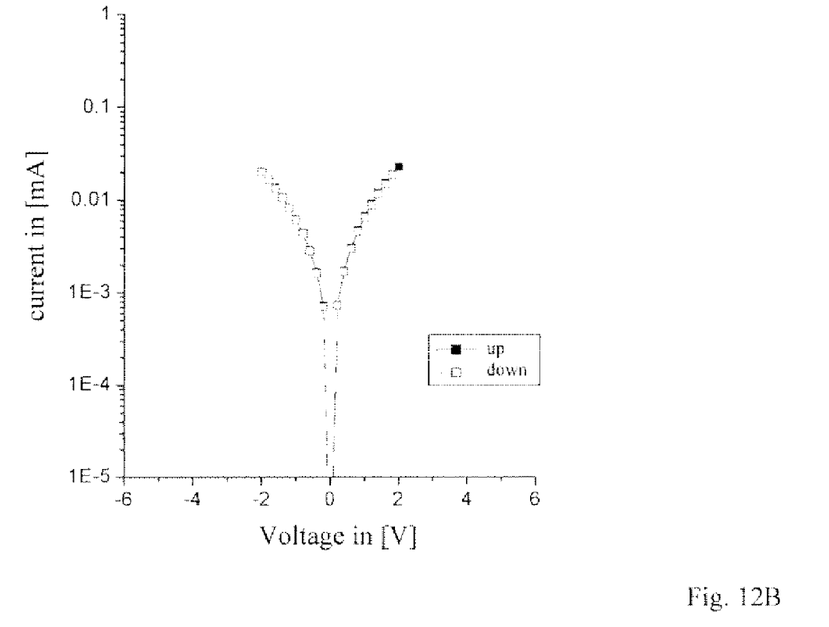
Figure 12C:
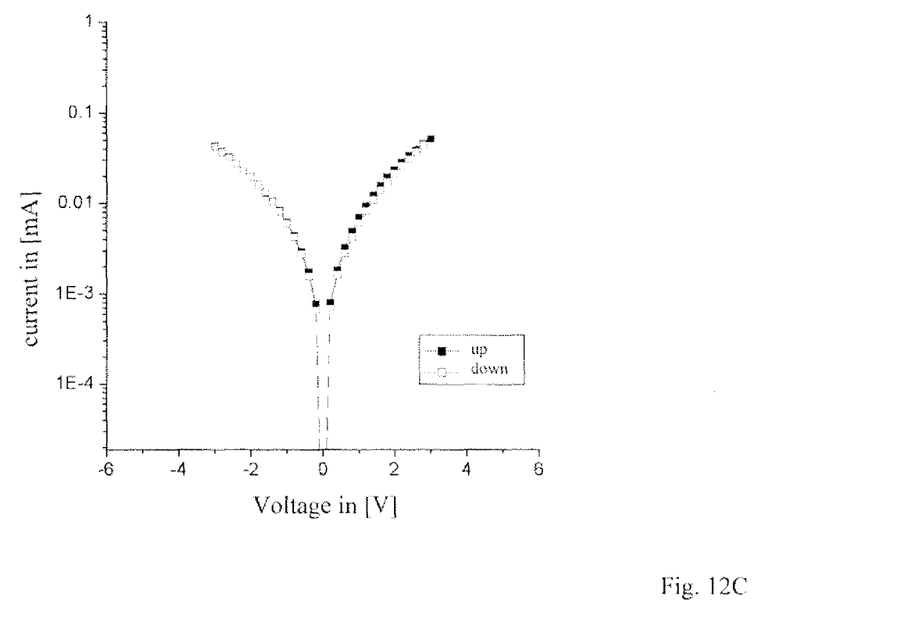
Figure 12D:
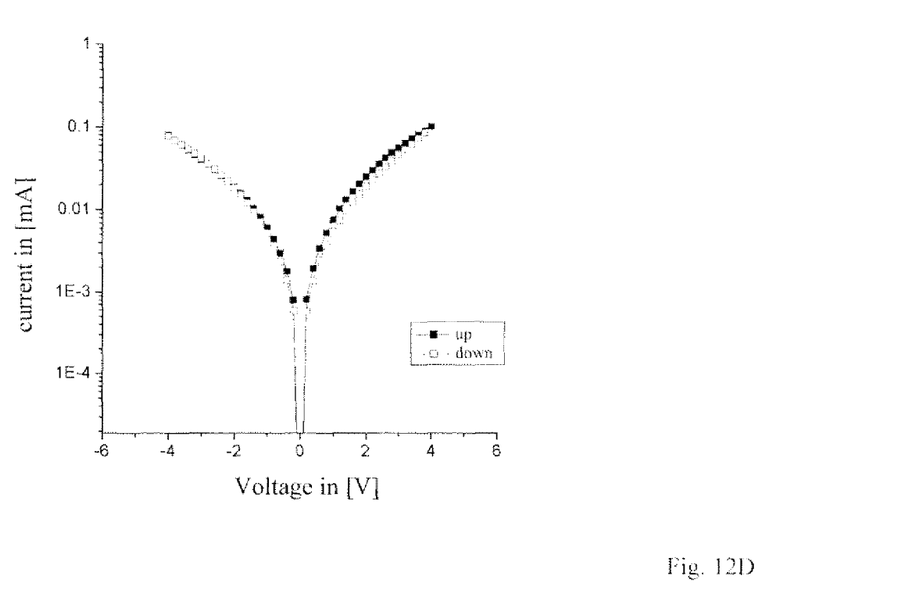
Figure 12E:
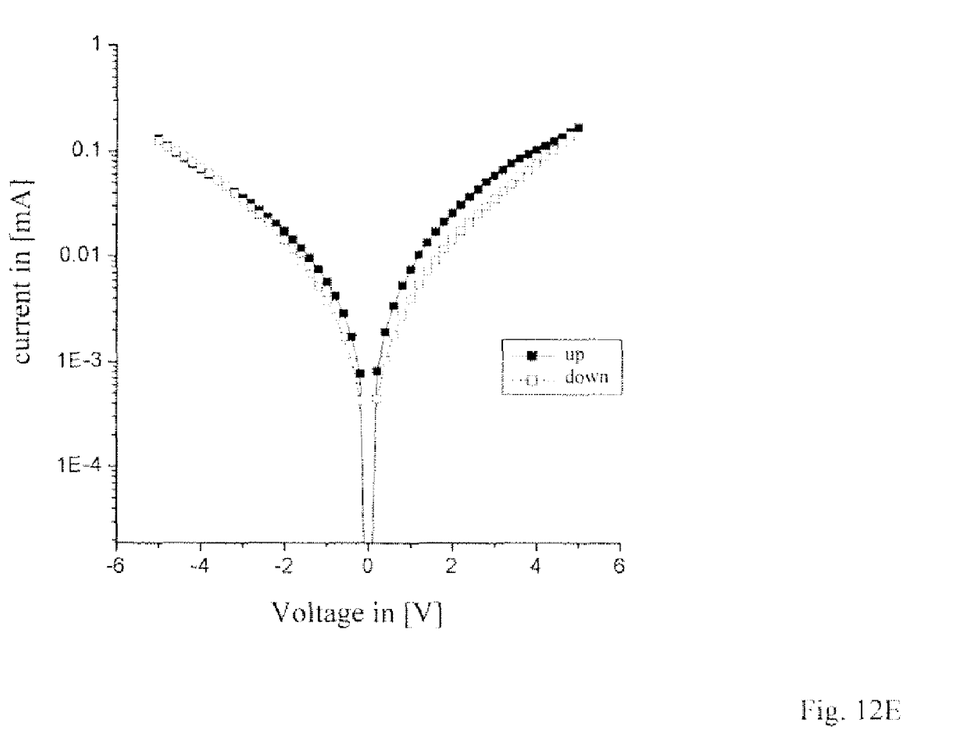

FIG. 10 shows a schematic illustration of a 3D-integration of a plurality of memory components according to FIG. 9 to form a memory component arrangement.

The features of the invention disclosed in the present description, the claims and drawings can be of significance both individually and in any combination in their different embodiments for the realisation of the invention.

The invention claimed is:

1. An organic electronic memory component comprising an electrode and a counterelectrode, and an organic layer arrangement disposed between said electrode and counterelectrode and in electrical contact therewith, wherein the organic layer arrangement comprises the following organic layers: an electrode side charge carrier transport layer and a counterelectrode side charge carrier-blocking layer and disposed between said electrode side charge carrier transport layer and counterelectrode-side charge carrier-blocking layer a memory layer region comprising a first charge carrier-storing layer and a second charge carrier-storing layer between which first charge carrier-storing layer and a second charge carrier-storing layer is disposed a charge carrier barrier layer, wherein the electrode is a cathode and the counterelectrode is an anode, the electrode-side charge-carrying transport layer is a cathode-side electron transport layer, the counterelectrode-side charge carrier-blocking layer is an anode-side electron-blocking layer, the first charge carrier-storing layer is an electron-storing layer, the second charge carrier-storing layer is a second electron-storing layer, and the charge carrier barrier layer is an electron barrier layer, and wherein the LUMO level of the cathode-side electron transport layer lies energetically higher than the LUMO level of the first electron-storing layer, which first electron-storing layer is disposed adjacently to the cathode-side electron transport layer;

the LUMO level of the anode-side electron-blocking layer lies energetically higher than the LUMO level of the second electron-storing layer, which second electron-storing layer is disposed adjacently to the anode-side electron-blocking layer; and the LUMO level of the first electron-storing layer and the second electron-storing layer lies energetically lower than the LUMO level of the electron barrier layer.

2. A memory component according to claim 1, wherein the electrode side charge-carrying transport layer is electrically doped.

3. The memory component according to claim 1, wherein a charge carrier injection layer is disposed between the electrode and the electrode side charge-carrying transport layer.

4. The memory component according to claim 1, wherein the LUMO level of the anode side electron-blocking layer lies energetically higher than the respective LUMO level of the following layers: the first electron-storing layer, the second electron-storing layer, and the cathode side electron transport layer.

5. The memory component according to claim 1, wherein the LUMO level of the first electron-storing layer or the LUMO level of the second electron-storing layer lies energetically around 0.1 eV to around 3.0 eV lower than the LUMO level of the anode-side electron-blocking layer.

6. An organic electronic memory component comprising an electrode and a counterelectrode, and an organic layer arrangement disposed between said electrode and counterelectrode and in electrical contact therewith, wherein the organic layer arrangement comprises the following organic layers: an electrode-side charge carrier transport layer and a counterelectrode-side charge carrier-blocking layer and disposed between said electrode-side charge carrier transport layer and counterelectrode-side charge carrier-blocking layer a memory layer region comprising a first charge carrier-storing layer and a second charge carrier-storing layer between which first charge carrier-storing layer and a second charge carrier-storing layer is disposed a charge carrier barrier layer, wherein the electrode is embodied as an anode, the counterelectrode is embodied as a cathode, and the electrode-side charge carrier transport layer is an anode-side hole transport layer, the counterelectrode-side charge carrier-blocking layer is a cathode-side hole-blocking layer, the first charge carrier-storing layer is a hole-storing layer, the second charge carrier-storing layer is a second hole-storing layer and the charge carrier barrier layer is a hole-barrier layer, and wherein the HOMO level of the anode side hole transport layer lies energetically higher than the HOMO level of the first hole-storing layer, which first hole-storing layer is disposed adjacently to the anode side hole transport layer;

the HOMO level of the cathode side hole-blocking layer lies energetically higher than the HOMO level of the second hole-storing layer, which second hole-storing layer is disposed adjacently with respect to the cathode side hole-blocking layer; and the HOMO level of the first hole-storing layer and second hole storing layer lies energetically higher than the HOMO level of the hole barrier layer.

7. The memory component according to claim 6, wherein the HOMO level of the cathode side hole-blocking layer lies energetically higher than the respective HOMO levels of the following layers: the first hole-storing layer, the second hole-storing layer and, the anode side hole transport layer.

8. The memory component according to claim 6, wherein the HOMO level of the first hole-storing layer or the HOMO level of the second hole-storing layer lies energetically around 0.1 eV to around 3.0 eV lower than the HOMO level of the cathode side hole-blocking layer.

9. The memory component according claim 1, wherein an electrical resistance via the electrode, the counterelectrode, and the organic layer arrangement in an on-status and an off-status respectively lies in a range between around 1Ohm to around 100 MOhm.

10. The memory component according to claim 1, wherein the ratio of the electrical resistance via the electrode, the counterelectrode and the organic layer arrangement in the on-status with respect to the electrical resistance in the off-status is greater than 1:1.5.

11. A memory component arrangement comprising several organic memory components according to claim 1 disposed in a stack, wherein a common intermediate electrode is disposed between mutually oppositely disposed memory components, wherein the common intermediate electrodes comprise electrode strips.

12. The memory component arrangement according to claim 11, wherein the external electrodes of the stack comprise electrode strips.

13. The memory component according claim 9, wherein an electrical resistance via the electrode, the counterelectrode, and the organic layer arrangement in an on-status and an off-status respectively lies in a range between around 0.1 kOhm to around 100 kOhm.

* * * * *